(12) United States Patent
Takano et al.

(10) Patent No.: US 11,251,769 B2
(45) Date of Patent: Feb. 15, 2022

(54) BULK ACOUSTIC WAVE COMPONENTS

(71) Applicant: Skyworks Solutions, Inc., Woburn, MA (US)

(72) Inventors: Atsushi Takano, Kadoma (JP); Takeshi Furusawa, Toyonaka (JP); Mitsuhiro Furukawa, Nishinomiya (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/599,032

(22) Filed: Oct. 10, 2019

(65) Prior Publication Data

US 2020/0127633 A1  Apr. 23, 2020

Related U.S. Application Data

(60) Provisional application No. 62/747,486, filed on Oct. 18, 2018.

(51) Int. Cl.
| | |
|---|---|
| *H03H 9/02* | (2006.01) |
| *H03H 3/02* | (2006.01) |
| *H01L 41/338* | (2013.01) |
| *H03H 9/10* | (2006.01) |
| *H03H 9/205* | (2006.01) |
| *H03H 9/56* | (2006.01) |
| *H03H 9/05* | (2006.01) |
| *H04B 1/3827* | (2015.01) |
| *H03F 3/20* | (2006.01) |

(52) U.S. Cl.
CPC ....... *H03H 9/02133* (2013.01); *H01L 41/338* (2013.01); *H03H 3/02* (2013.01); *H03H 9/02102* (2013.01); *H03H 9/02125* (2013.01); *H03H 9/0514* (2013.01); *H03H 9/105* (2013.01); *H03H 9/205* (2013.01); *H03H 9/566* (2013.01); *H03F 3/20* (2013.01); *H03F 2200/451* (2013.01); *H04B 1/3827* (2013.01)

(58) Field of Classification Search
CPC combination set(s) only.
See application file for complete search history.

(56) References Cited

U.S. PATENT DOCUMENTS

| | | |
|---|---|---|
| 6,492,196 B1 | 12/2002 | Chen |
| 7,863,699 B2 | 1/2011 | Dropmann et al. |
| 10,389,331 B2 | 8/2019 | Hurwitz |

(Continued)

FOREIGN PATENT DOCUMENTS

JP  2008034515  2/2008

OTHER PUBLICATIONS

Johnston, Christopher, "Plasma dicing methods for thin wafers," Chip Scale Review, vol. 20, No. 3, May-Jun. 2016, pp. 54-56.

(Continued)

*Primary Examiner* — Junpeng Chen
(74) *Attorney, Agent, or Firm* — Knobbe, Martens, Olson & Bear, LLP (57) ABSTRACT

Aspects of this disclosure relate to bulk acoustic wave components. A bulk acoustic wave component can include a substrate, at least one bulk acoustic wave resonator on the substrate, and a cap enclosing the at least one bulk acoustic wave resonator. The cap can include a sidewall spaced apart from an edge of the substrate. The sidewall can be 5 microns or less from the edge of the substrate.

22 Claims, 9 Drawing Sheets

(56) References Cited

U.S. PATENT DOCUMENTS

| | | |
|---|---|---|
| 2003/0077878 A1 | 4/2003 | Kumar et al. |
| 2003/0100143 A1 | 5/2003 | Mulligan et al. |
| 2004/0188819 A1 | 9/2004 | Farnworth et al. |
| 2006/0012021 A1* | 1/2006 | Larson, III ............... H03H 3/02 257/686 |
| 2006/0131731 A1 | 6/2006 | Sato |
| 2009/0011543 A1 | 1/2009 | Karta et al. |
| 2009/0221129 A1 | 9/2009 | Barber et al. |
| 2012/0074555 A1* | 3/2012 | Snyder ................... H01L 24/32 257/684 |
| 2013/0119489 A1 | 5/2013 | Chang et al. |
| 2013/0313947 A1* | 11/2013 | Chen .................... H03H 9/1057 310/348 |
| 2014/0252375 A1 | 9/2014 | Briere |
| 2015/0381144 A1 | 12/2015 | Bradley et al. |
| 2016/0096727 A1 | 4/2016 | Romig et al. |
| 2017/0271222 A1 | 9/2017 | Kang et al. |
| 2018/0138892 A1* | 5/2018 | Caron .................... H04L 5/1461 |
| 2018/0158801 A1* | 6/2018 | Takano ................ H03H 9/0523 |
| 2018/0159502 A1 | 6/2018 | Takano |
| 2018/0166396 A1 | 6/2018 | Lee et al. |
| 2018/0234076 A1* | 8/2018 | Ando ....................... H03H 9/13 |
| 2018/0275485 A1 | 9/2018 | Hurwitz |
| 2018/0278227 A1 | 9/2018 | Hurwitz |
| 2018/0278228 A1 | 9/2018 | Hurwitz |
| 2020/0127632 A1 | 4/2020 | Takano et al. |

OTHER PUBLICATIONS

MEMS Manufacturing 2018, Speakers and Presentation Topics, available at: http://www.memsmanufacturing.com/speakers.html (accessed Sep. 24, 2018).

Orbotech, "Plasma Dicing (Dice Before Grind)," copyright dated 2018, available at: http://www.orbotech.com/spts/resources/tech-insights/mems-tech-insights/plasma-dicing-dbg (accessed Sep. 24, 2018).

Orbotech, "Plasma Dicing: Application Brief," copyright dated 2019, Q3/2019, https://www.orbotech.com/assets/media/dicing-a4-02-09-2019.pdf (accessed Oct. 14, 2019).

Plasma-Therm, "Plasma Dicing," copyright dated 2010-2015, available at: http://www.plasma-therm.com/plasma-dicing.html (accessed Sep. 24, 2018).

Plasma-Therm, "Singulator® MDS-100, MDS-300," copyright dated 2010-2015, available at: http:www.plasma-therm.com/singulator.html (accessed Sep. 24, 2018).

Takano, et al., U.S. Appl. No. 16/599,020, filed Oct. 10, 2019, Methods of Plasma Dicing Bulk Acoustic Wave Components.

* cited by examiner

BULK ACOUSTIC WAVE COMPONENTS

CROSS REFERENCE TO PRIORITY APPLICATION

This application claims the benefit of priority of U.S. Provisional Patent Application No. 62/747,486, filed Oct. 18, 2018 and titled "BULK ACOUSTIC WAVE COMPONENTS AND METHODS OF PLASMA DICING THE SAME," the disclosure of which is hereby incorporated by reference in its entirety herein.

BACKGROUND

Technical Field

Embodiments of this disclosure relate to acoustic wave components and, more specifically, to bulk acoustic wave components.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of acoustic wave resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

BAW components can include packaged BAW resonators enclosed within a sealed portion. Packaging structures add to the size of the BAW component. There is a desire for reducing the size of BAW components without sacrificing reliability and performance.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a method of manufacturing singulated bulk acoustic wave components. The method includes forming a buffer layer over a substrate of an array of bulk acoustic wave components so as to form exposed streets between individual bulk acoustic wave components. The method also includes plasma dicing the bulk acoustic wave components along the exposed streets to thereby singulate the bulk acoustic wave components.

Each of the singulated bulk acoustic wave components can include a bulk acoustic wave resonator and a cap enclosing the bulk acoustic wave resonator. The cap can include a sidewall that is 5 microns or less from an edge of the substrate of the respective singulated bulk acoustic wave component. The sidewall can be at least 1 micron from the edge of the respective singulated bulk acoustic wave component. The sidewall can include copper.

The plasma dicing can include etching through both the substrate and a cap substrate. The bulk acoustic wave component can include a bulk acoustic wave resonator located over the substrate and under the cap substrate. The substrate and the cap substrate can be silicon substrates.

The method can further include forming a conductor over the substrate. The conductor can extend laterally from a via that extends through the substrate. The conductor can be electrically connected to a conductive layer in the via. Forming the buffer layer can be performed such that the buffer layer is over at least a portion of the conductor. The method can further include forming solder over the conductor such that the solder is non-overlapping with the via.

The substrate can be a silicon substrate. The buffer layer can be a material that etches at least 30 times slower than silicon during the plasma dicing. The buffer layer can include a resin. Forming the buffer layer can include forming the exposed streets by way of a photolithographic process.

The bulk acoustic wave components can each include a film bulk acoustic wave resonator.

Another aspect of this disclosure is a method of manufacturing bulk acoustic wave components. The method includes providing a first wafer bonded with a second wafer. The first wafer has bulk acoustic resonators thereon. The second wafer is over and spaced apart from the bulk acoustic resonators. The method includes forming a buffer layer on a side of the first wafer that is opposite to the bulk acoustic wave resonators such that streets are exposed. The method includes plasma dicing through the first wafer and the second wafer along the exposed streets to form singulated bulk acoustic wave components.

The first wafer and the second wafer can be silicon wafers.

Each of the singulated bulk acoustic wave components can include a bulk acoustic wave resonator of the bulk acoustic wave resonators and a cap enclosing the bulk acoustic wave resonator. The cap can include a sidewall. The sidewall can be in a range from 1 micron to 5 microns away from an edge of a substrate of the respective singulated bulk acoustic wave component, in which the substrate corresponds to a portion of the first wafer prior to plasma dicing.

Another aspect of this disclosure is a method of manufacturing bulk acoustic wave components. The method includes forming a buffer layer over a silicon substrate of bulk acoustic wave components such that streets are exposed. The method also includes plasma dicing the bulk acoustic wave components along the exposed streets to thereby singulate the bulk acoustic wave components. The singulated bulk acoustic wave components each include a bulk acoustic wave resonator and a cap enclosing the bulk acoustic wave resonator. The cap includes a silicon cap substrate and a sidewall that is spaced apart from an edge of the silicon substrate of the respective singulated bulk acoustic wave component by a distance in a range from 1 micron to 5 microns.

The sidewall can include copper. The he buffer layer can include a resin. The bulk acoustic wave resonator can be a film bulk acoustic wave resonator.

Another aspect of this disclosure is a bulk acoustic wave component that includes a substrate, at least one bulk acoustic wave resonator on the substrate, and a cap enclosing the at least one bulk acoustic wave resonator. The cap includes a sidewall spaced apart from an edge of the substrate. The sidewall is 5 microns or less from the edge of the substrate.

The sidewall can be 3 microns or less from the edge of the substrate. The sidewall can be at least 1 micron from the edge of the substrate.

The bulk acoustic wave component can further include a via extending through the substrate, a conductive layer in the via, and a buffer layer in the via.

The bulk acoustic wave component can further include a via extending through the substrate, a conductor extending laterally from the via and electrically connected with conductive layer in the via, and solder on the conductor and located laterally from the via.

The at least one bulk acoustic wave resonator can include a film bulk acoustic wave resonator. The at least one bulk acoustic wave resonator can include a solidly mounted resonator.

The substrate can be a silicon substrate. A top portion of the cap can include a silicon cap substrate.

The sidewall can include copper.

The at least one bulk acoustic wave resonator can include a plurality of bulk acoustic wave resonators included in a filter arranged to filter a radio frequency signal. The plurality of bulk acoustic wave resonators can include at least 10 bulk acoustic wave resonators.

Another aspect of this disclosure is a bulk acoustic wave component that includes a silicon substrate, at least one bulk acoustic wave resonator on the silicon substrate, and a cap enclosing the at least one bulk acoustic wave resonator. The cap includes a cap substrate and a sidewall. The cap substrate includes silicon. The sidewall is spaced apart from an edge of the silicon substrate by a distance in a range from 1 micron to 5 microns.

The bulk acoustic wave component can further include a via extending through the silicon substrate, a conductive layer in the via, and a buffer layer in the via.

The bulk acoustic wave component can further include a via extending through the substrate, a conductor extending laterally from the via and electrically connected with conductive layer in the via, and solder on the conductor and located laterally from the via.

The sidewall can include copper. The at least one bulk acoustic wave resonator can include at least 10 bulk acoustic wave resonators included in an acoustic wave filter arranged to filter a radio frequency signal.

Another aspect of this disclosure is a wireless communication device that includes an antenna and a bulk acoustic wave component. The bulk acoustic wave component includes a substrate, bulk acoustic wave resonators on the substrate, and a cap enclosing the bulk acoustic wave resonators. The cap includes a sidewall that is spaced apart from an edge of the substrate by 5 microns or less. The bulk acoustic wave resonators is included in a filter in communication with the antenna.

The wireless communication device can be a mobile phone.

The wireless communication device can further include a radio frequency amplifier in communication with the filter and a switch coupled between the filter and the antenna.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/599,020, titled "METHODS OF PLASMA DICING BULK ACOUSTIC WAVE COMPONENTS," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can include a bulk acoustic wave (BAW) component. The BAW component can include a single die. The BAW component can include one or more BAW resonators on a substrate, such as a silicon substrate. The one or more BAW resonators can be enclosed by a cap of the BAW component. The cap can include another silicon substrate and sidewalls. The cap can form a hermetic seal around the one or more BAW resonators. The sidewalls can include copper, for example.

BAW components can be manufactured by dicing bonded wafers with a hollow portion between the wafers. Chipping has occurred in a portion of a BAW component facing the hollow portion. When there is a relatively big chip, a hermetic seal around BAW resonators can be broken. To reduce and/or eliminate the risk of chipping, BAW components can include a space between an edge of the BAW component and the sealed portion. The space can be, for example, about 15 to 20 microns from a sidewall of a cap to a diced edge of a BAW component. The space can consume area of BAW components.

Aspects of this disclosure relate to a plasma dicing method for bulk acoustic wave components. A buffer layer can be formed over bulk acoustic wave components to cover a re-wiring layer. The buffer layer can be formed such that streets for dicing are exposed. The buffer layer can serve as a masking layer for plasma dicing. BAW components can be singulated by plasma dicing. Plasma dicing can result in less chipping of BAW components relative to other dicing techniques, such as blade dicing or laser dicing. With plasma dicing, a sidewall of a cap enclosing one or more BAW resonators can be closer to a diced edge of the BAW component than for other dicing techniques without increasing chipping risk for BAW components. The plasma dicing can involve dicing through an upper wafer and a lower wafer across a hollow portion. The upper wafer and the lower wafer can be silicon wafers.

With plasma dicing, the size of BAW components can be reduced. With less space between a sidewall of a cap and an edge of a BAW component, more BAW components can be included on a wafer. Moreover, the BAW components can consume less area in modules.

Blade dicing techniques typically dice sharp edges and there can be side stress in blade dicing a chip. This can result in cracking and/or chipping at a sharp edge of a blade diced component. With plasma dicing, a pattern can be made with a photolithographic process for dicing and there can be no significant mechanical side stress during plasma dicing. Accordingly, a sharp edge can be maintained with plasma dicing while reducing and/or eliminating damage that can result from mechanical breaking. In certain instances, plasma dicing can result in corners of a BAW component that are more rounded with more reliable performance compared to mechanical breaking techniques. Rounded corners can reduce and/or eliminate the risk of BAW components cracking and/or chipping.

Using manufacturing techniques disclosed herein, the yield of BAW components from a single wafer can be improved by about 10% to 18% relative to a previous manufacturing method in certain instances. The improvement in yield can reduce manufacturing costs. Manufacturing costs can be reduced even if there is an increase in costs as a result of additional processing operations and/or facility investment, due to the improved yield.

Figure 1:
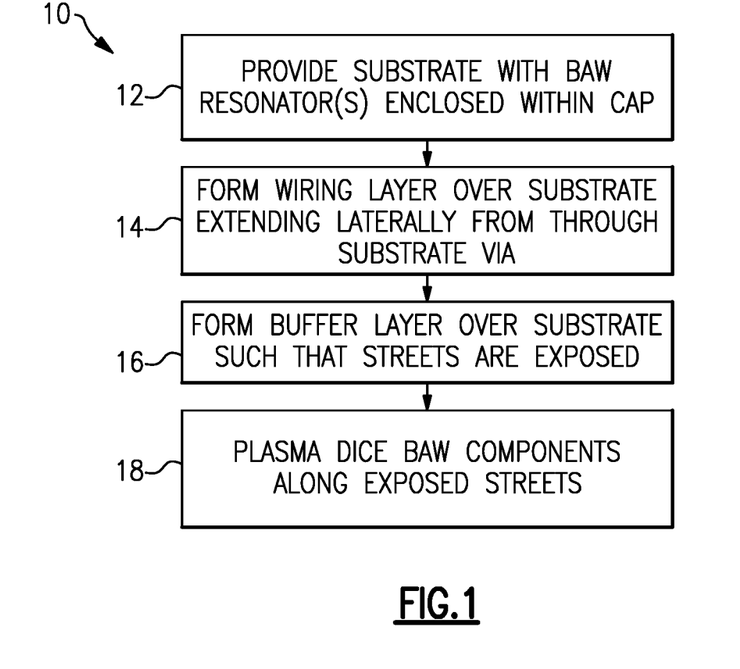
FIG. 1 is a flow diagram of an example process of manufacturing bulk acoustic wave components according to an embodiment.

Methods of manufacturing BAW components with plasma dicing are disclosed. FIG. 1 is a flow diagram of an example process 10 of manufacturing bulk acoustic wave components according to an embodiment. The process 10 will be described with reference to cross sectional views illustrated in FIGS. 2A to 2E. Any of the methods discussed herein may include more or fewer operations and the operations may be performed in any order, as appropriate.

The process 10 includes providing a substrate with one or more BAW resonators enclosed within a cap at block 12. The substrate can be a silicon substrate. The cap can include sidewalls and a second substrate that together enclose the one or more BAW resonators. The second substrate can be a silicon substrate. The one or more BAW resonators can include a film bulk acoustic wave resonator (FBAR) and/or a solidly mounted resonator (SMR).

A re-wiring layer is formed over the substrate at block 14. The re-wiring layer includes a conductor that extends laterally from a through substrate via. The re-wiring layer can be referred to as a wiring layer. The re-wiring layer can be formed during the same processing operation(s) as forming a conductive layer in one or more though substrate vias of a BAW component. The re-wiring layer and the conductive layer can be around 5 microns thick, for example. Solder can be formed over a portion of the re-wiring layer. The re-wiring layer can provide an electrical connection from the conductive layer in a though substrate via to solder of the BAW component. With the re-wiring layer, solder can be formed over any suitable part of a substrate. For instance, the solder can be formed laterally from a through substrate via. The solder and the through substrate via are non-overlapping in certain instances.

Figure 2A:
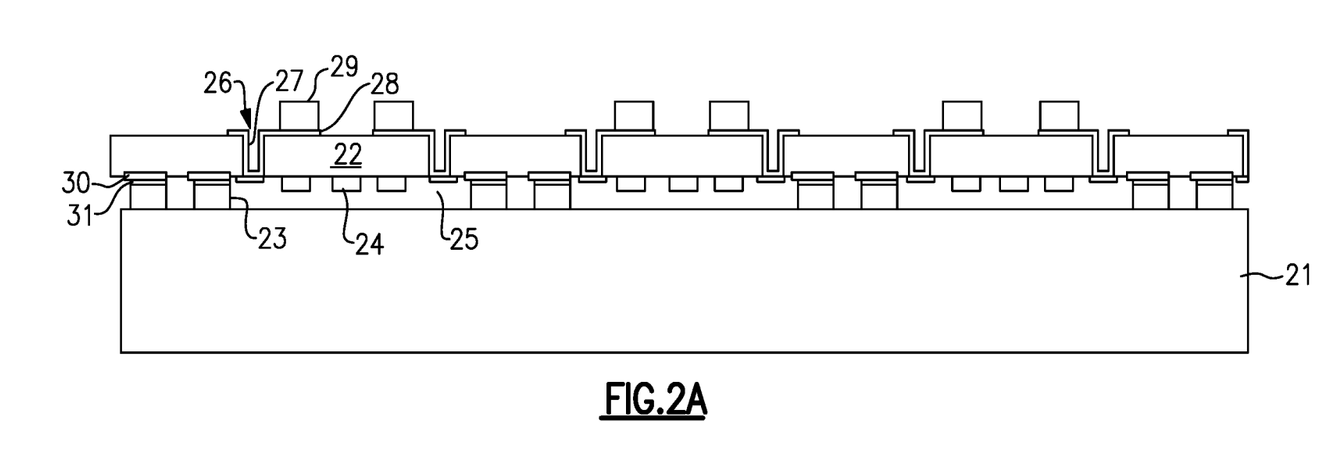
FIGS. 2A to 2E are a cross sectional views illustrating a process of manufacturing of bulk acoustic wave components according to an embodiment.

FIG. 2A illustrates a cross section of a plurality of BAW components with the re-wiring layer that is formed at block 14 of the process 10. As illustrated in FIG. 2A, the plurality of BAW components have not yet have been singulated. FIG. 2A illustrates a cap substrate 21, a substrate 22, sidewalls 23, BAW resonators 24, air cavities 25, through substrate vias 26, a conductive layer 27 in respective though substrate vias 26, a re-wiring layer 28, and electrodes 29. Before individual BAW components are singulated, a first wafer includes the substrate 22 of each of the individual BAW components and a second wafer includes the cap substrate 21 of each of the individual BAW components. As illustrated, the first wafer is bonded to the second wafer.

The BAW resonators 24 are enclosed within a cap that includes the cap substrate 21 and sidewalls 23. The BAW resonators 24 are enclosed within the cap before the re-wiring layer 28 is formed. As illustrated, a bonding layer 30 and a cap layer 31 can be located between the substrate 22 and the side wall 23. The bonding layer 30 can be a gold layer. The cap layer 31 can be a tin cap layer. The cap forms a hermetic seal around the BAW resonators 24. Accordingly, an air cavity 25 can be included within the cap around the BAW resonators 24. In some instances, a BAW component can include 10 to 50 BAW resonators 24 enclosed within a cap. The BAW resonators 24 can include one or more FBARs. Alternatively or additionally, the BAW resonators 24 can include one or more SMRs. The BAW resonators 24 can be included in one or more filters. The substrate 21 can be a silicon substrate. The sidewalls 23 can include copper.

The BAW resonators 24 are on the substrate 22 and enclosed by the cap. The substrate 22 can be a silicon substrate. The conductive layer 27 in the though substrate vias 26 can provide an electrical connection from one or more of the BAW resonators 24 to elements on an opposing side of the substrate 22. As illustrated, the re-wiring layer 28 formed at block 14 is over the substrate 22 and extends laterally from the though substrate vias 26. Accordingly, electrodes 29 can be formed over the re-wiring layer 28 laterally from the though substrate vias 26. The re-wiring layer 28 is on an opposite side of the substrate 22 than the BAW resonators 24. The electrodes 29 provide terminals for external connections to BAW components. With the re-wiring layer 28, the electrodes 29 can be positioned at any suitable location of a BAW component. The re-wiring layer 28 can provide shielding. The re-wiring layer 28 can shield the BAW resonators 24 from external components and/or shield external components form the BAW resonators 24.

Referring back to FIG. 1, a buffer layer is formed over the substrate such that streets are exposed at block 16. The buffer layer can be formed by way of a photolithographic process. Forming the buffer layer can include depositing a layer of buffer material, masking certain areas over the buffer material, and applying light to remove the buffer material over the streets. A surface of the substrate can be exposed along the streets. The buffer layer can provide encapsulation of BAW components on a side opposite the cap substrate. The buffer layer can be formed over the re-wiring layer formed at block 14.

Figure 2B:
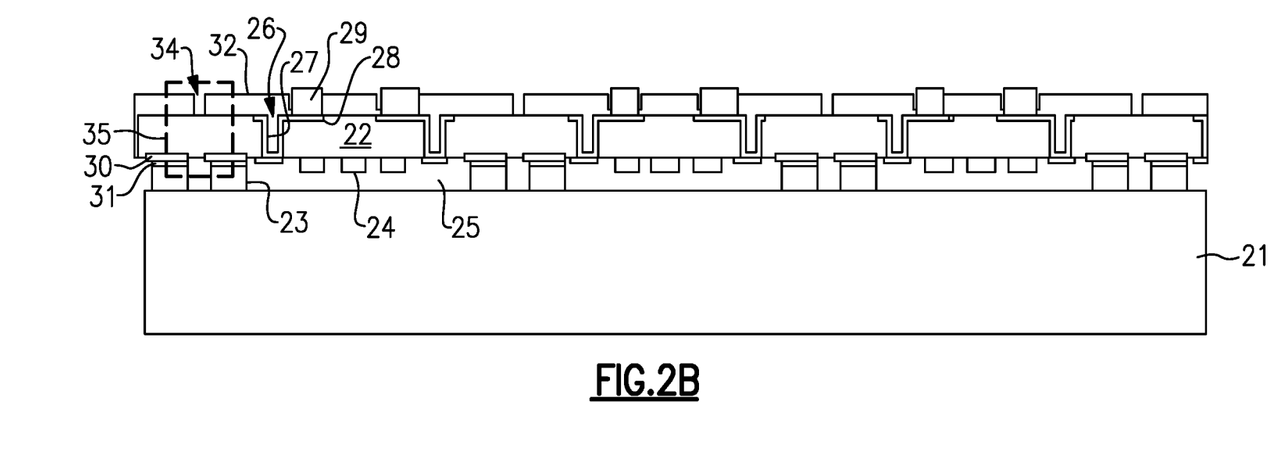

FIG. 2B illustrates a cross section of BAW components that includes a buffer layer 32 formed at block 16 of the process 10. The buffer layer 32 is over the substrate 22. The buffer layer 32 is on an opposite side of the substrate 22 than the BAW resonators 24. A portion of the buffer layer 32 is within through substrate vias 26. The buffer layer 32 is also over portions of the re-wiring layer 28. As shown in FIG. 2B, the buffer layer 32 is formed such that the electrodes 29 remain exposed. The buffer layer 32 includes a material that serves as a mask to resist etching while the substrate 22 is plasma diced. For instance, the buffer layer 32 can be a material that is etched less than silicon while silicon is etched for a substrate 22 that is a silicon substrate. Typically, an etching rate of the buffer layer 32 is over 30 times slower compared with an etching rate of silicon. Therefore, a typical buffer layer thickness is sufficient for plasma dicing the wafers. The buffer layer 32 can be a polyimide layer, a phenol resin layer such as a phenol resin layer with rubber filler, or any other suitable buffer layer. The streets 34 facilitate dicing of the BAW components.

Figure 2C:
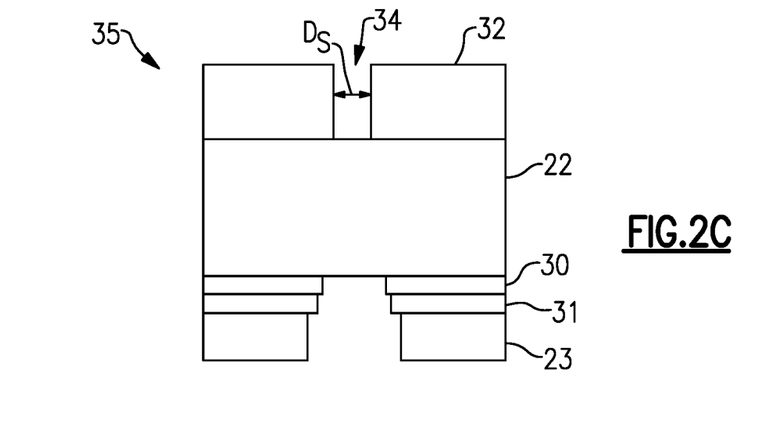

FIG. 2C illustrates a zoomed in view of a portion 35 of the BAW components illustrated in FIG. 2B. As illustrated, the street 34 can have a width $D_S$. The width $D_S$ is suitable for plasma dicing as illustrated. The width $D_S$ of the street 34 can be in a range from about 10 microns to 20 microns, such as in a range from 10 microns to 15 microns. As one example, the width $D_S$ of the street 34 can be about 15 microns. FIG. 2C also illustrates that a bonding layer 30 and a cap layer 31 can be included between the substrate 22 and the sidewall 23.

Referring back to FIG. 1, BAW components are plasma diced along the exposed streets at block 18. This singulates the BAW components. In other words, the BAW components are separated from each other into individual BAW components by plasma dicing. The plasma dicing can involve dry etching through a substrate on which BAW resonators are located and through a cap substrate. There can be a hollow portion between the substrate and the cap substrate under the street (e.g., as shown in FIG. 2B) during this etching. As an example, the substrate and the cap substrate can both be silicon substrates that are etched at a rate of approximately 20 microns per minute. In this example, the substrate and the cap substrate can together be about 200 microns thick and it can take about 10 minutes to etch through about 200 microns of silicon. With plasma dicing, chipping of singulated BAW components can be reduced relative to other dicing methods, such as blade dicing or laser dicing. For plasma dicing, a photolithographic process can pattern any suitable pattern for streets. In certain instances, this can result in rounded corners for singulated BAW components. Such rounded corners can reduce the risk of the BAW component cracking and/or chipping to thereby increase reliability of the BAW component.

Figure 2D:
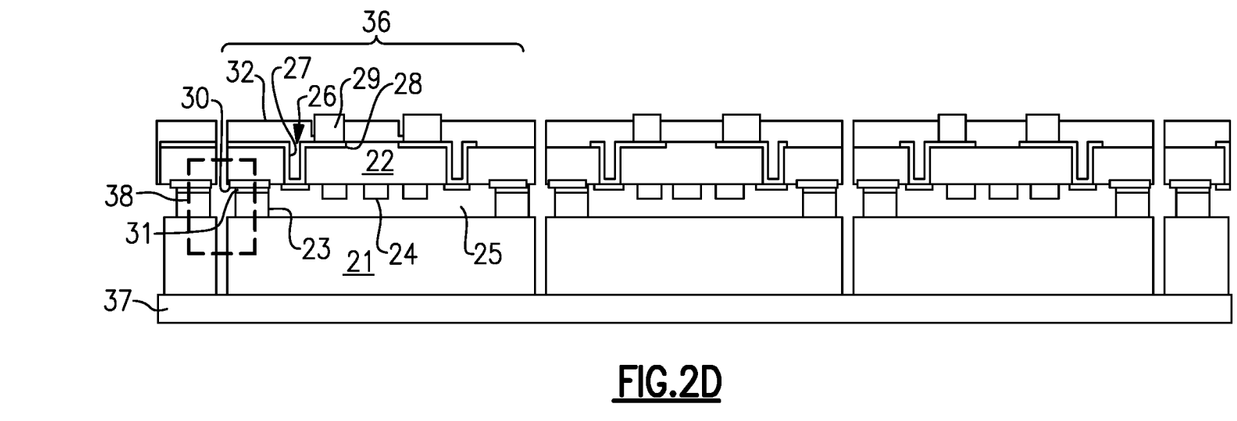

FIG. 2D illustrates a cross section of the BAW components after plasma dicing at block 18 of the process 10. Plasma dicing along streets can remove portions of the substrate 22 and the cap substrate 21 to thereby separate individual BAW components. A plurality of singulated BAW components 36 are shown in FIG. 2D. Tape 37 can hold the singulated BAW components 36 together. The tape 37 can be laminated to the BAW components prior to the plasma dicing.

Figure 2E:
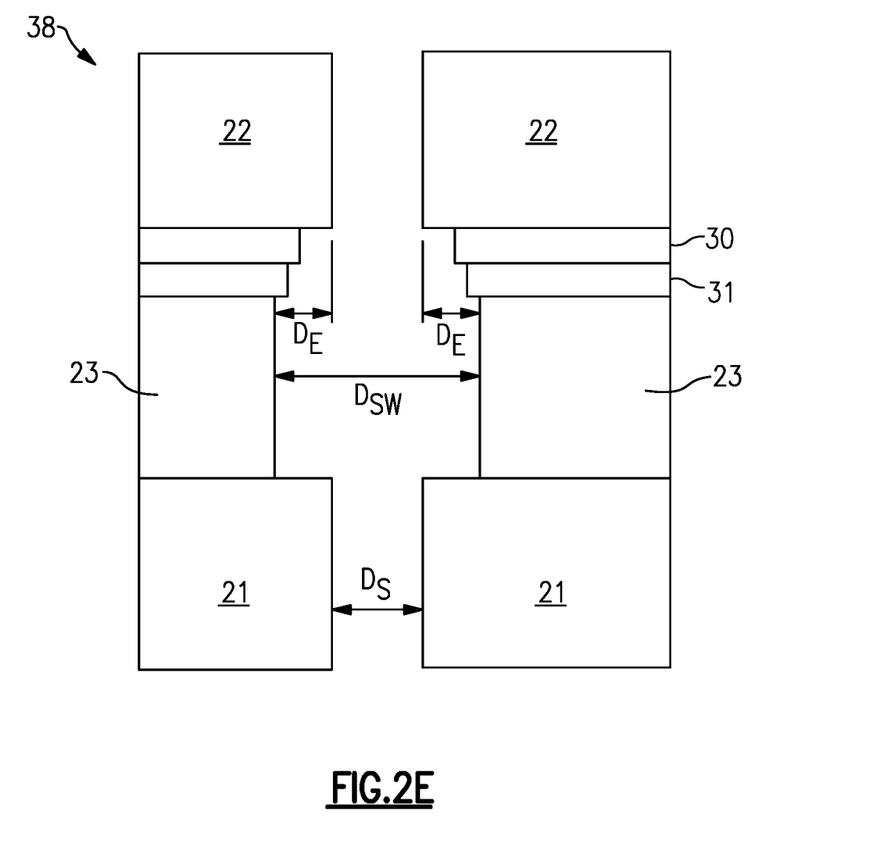

FIG. 2E illustrates a zoomed in view of a portion 38 of singulated BAW components 36 illustrated in FIG. 2D. As illustrated, a distance $D_E$ from a sidewall 23 to an edge of the substrate 22 of a singulated BAW component 36 is relatively small. Using a buffer layer as the mask for plasma dicing, a photolithography process can be used. Therefore, plasma dicing has a greater accuracy than other dicing methods, such as blade dicing or laser dicing with a mechanical system accuracy. For example, plasma dicing can be performed within an accuracy of +/−2 microns. However, in the case of blade dicing, mechanical accuracy is +/−10 microns and there can be 5 to 10 microns of chipping. With the increased accuracy and reduced risk of chipping for plasma dicing, the distance $D_E$ from the sidewall 23 to the edge of the substrate 22 of the singulated BAW component 36 can be reduced. The distance $D_E$ from the sidewall 23 to the edge of the substrate 22 of the singulated BAW component 36 can be less than 5 microns. The distance $D_E$ can be less than 3 microns. As one example, the distance $D_E$ can be about 2.5 microns. The distance $D_E$ is greater than zero as illustrated. In some instances, the distance $D_E$ can be in a range from 1 micron to 5 microns, such as in a range from 1 microns to 3 microns. The sidewall 23 and the edge of the substrate 22 can be substantially flush in a singulated BAW component in certain instances.

Accordingly, with plasma dicing, there can be less space between respective sidewalls 23 of adjacent BAW components on a wafer. A distance $D_{SW}$ from sidewalls 23 of respective adjacent singulated BAW components corresponds to the sum of the street width $D_S$ and twice the distance $D_E$ in FIG. 2E. The distance $D_{SW}$ can be in a range from about 10 microns to 30 microns, for example. In some instances, the distance $D_{SW}$ can be in a range from about 10 microns to 20 microns. As an example, the street width $D_S$ can be about 15 microns and the distance $D_E$ can be about 2.5 microns, which would make the distance $D_S$ w about 20 microns in the cross section illustrated in FIG. 2E.

Figure 3A:
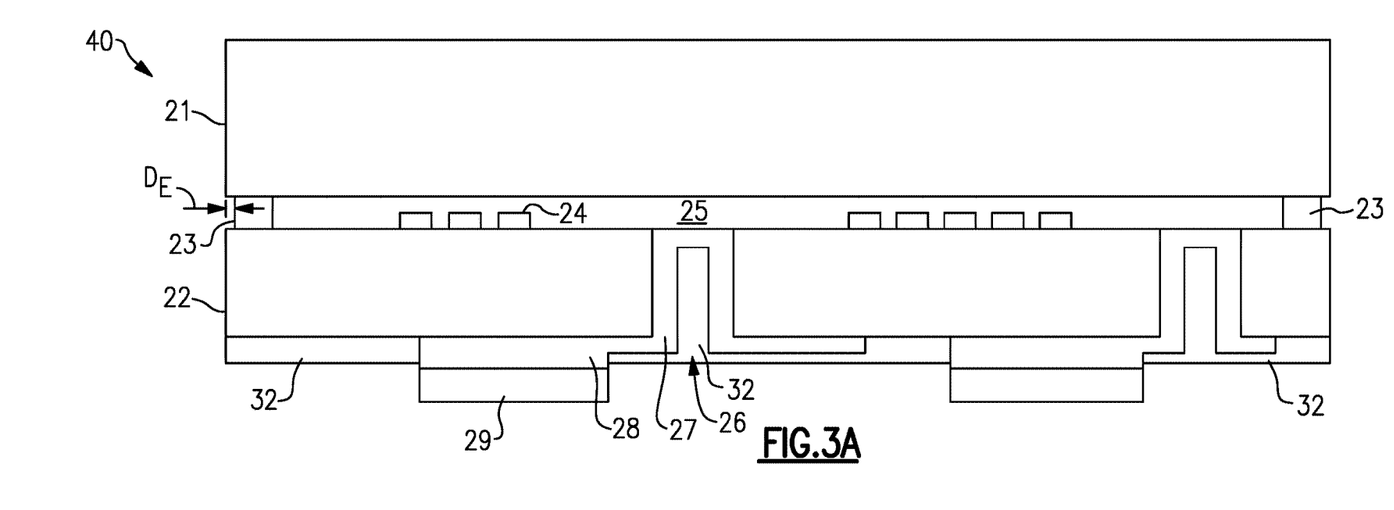
FIG. 3A is a cross sectional diagram of a bulk acoustic wave component according to an embodiment.

FIG. 3A is a cross sectional diagram of a bulk acoustic wave component 40 according to an embodiment. The BAW component 40 can be manufactured by a process that includes plasma dicing. For instance, the bulk acoustic wave component 40 can correspond to a singulated BAW component manufactured by the process 10 of FIG. 1.

As shown in FIG. 3A, the distance $D_E$ from a sidewall 23 to an edge of the substrate 22 of a singulated BAW component 36 can be relatively small as a result of plasma dicing. The distance $D_E$ can be in any of the ranges and/or have any of the values disclosed herein, such as described with reference to FIG. 2E. In illustrated the BAW component 40, BAW resonators 24 are enclosed within a cap that include cap substrate 21 and sidewalls 23. The BAW resonators 24 can form some or all of the resonators of one or more acoustic wave filters. There can be any suitable number of BAW resonators 24 enclosed within the cap of the BAW component 40. For instance, there can be 10 to 50

BAW resonators 24 enclosed within the cap of the BAW component 40. The BAW resonators 24 can be electrically connected to an electrode 29 by way of a conductive layer 27 in a through substrate via 26 and a re-wiring layer 28. The buffer layer 32 extends over the re-wiring layer 28 and is included within the through substrate via 26 in the BAW component 40.

Figure 3B:
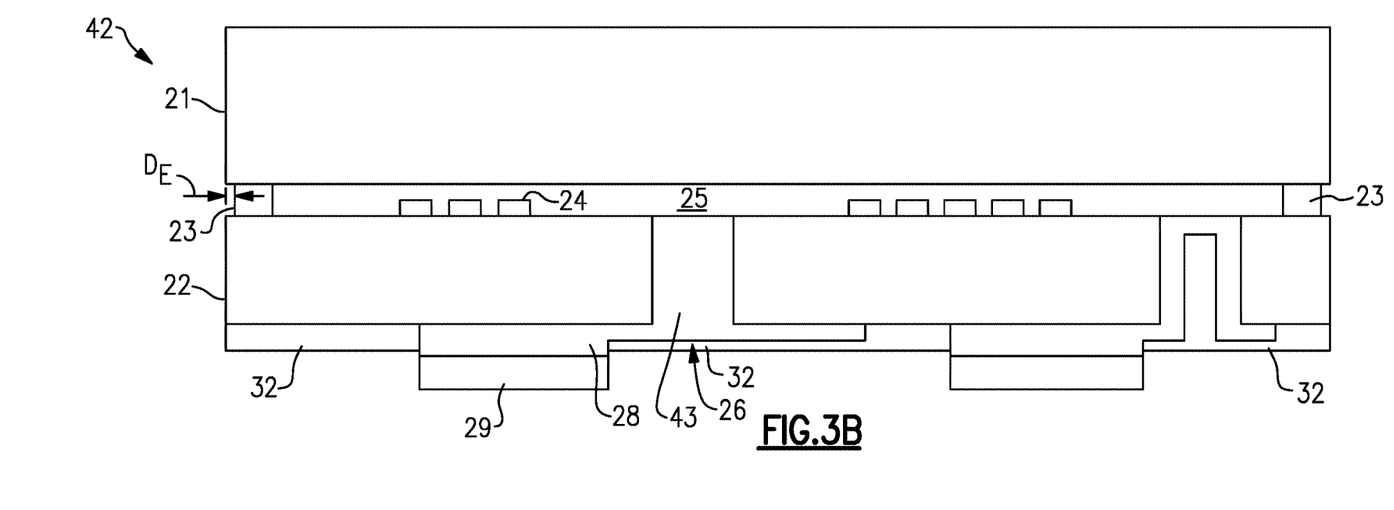
FIG. 3B is a cross sectional diagram of a bulk acoustic wave component according to another embodiment.

FIG. 3B is a cross sectional diagram of a bulk acoustic wave component 42 according to an embodiment. The BAW component 42 can be manufactured by a process that includes plasma dicing. For instance, the bulk acoustic wave component 42 can correspond to a singulated BAW component manufactured by the process 10 of FIG. 1. The BAW component 42 is like the BAW component 40 of FIG. 3A except that the BAW component 42 includes a via 26 that is filled with conformal conductive layer 43 instead of a conductive layer 27. The conformal conductive layer 43 can be a copper layer, for example. The bulk acoustic wave component 42 illustrates that the via 26 can be filled with a conformal layer 43.

One or more bulk acoustic wave resonators of a bulk acoustic wave component including any suitable combination of features disclosed herein be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators of any bulk acoustic wave component disclosed herein. FR1 can be from 410 megahertz (MHz) to 7.125 gigahertz (GHz), for example, as specified in a current 5G NR specification. One or more bulk acoustic wave resonators of a bulk acoustic wave component in accordance with any suitable principles and advantages disclosed herein can be included in a filter arranged to filter a radio frequency signal in a fourth generation (4G) Long Term Evolution (LTE) operating band and/or in a filter with a passband that spans at least one 4G LTE operating band and at least one 5G NR operating band.

Figure 4:
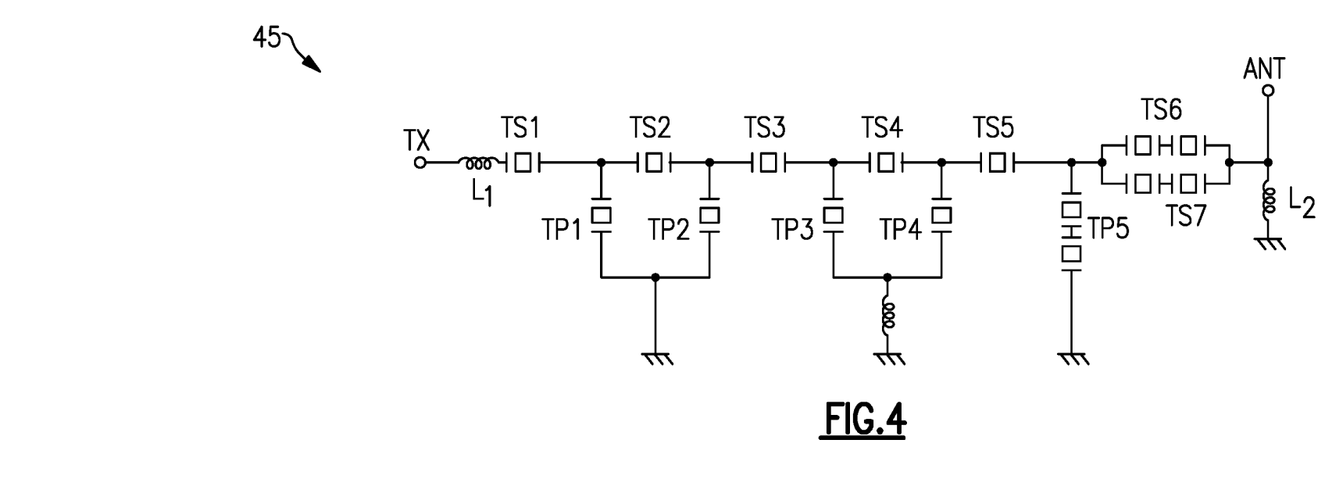
FIG. 4 is a schematic diagram of a transmit filter that includes bulk acoustic wave resonators of a bulk acoustic wave component according to an embodiment.

FIG. 4 is a schematic diagram of a transmit filter 45 that includes bulk acoustic wave resonators of a bulk acoustic wave component according to an embodiment. The transmit filter 45 can be a band pass filter. The illustrated transmit filter 45 is arranged to filter a radio frequency signal received at a transmit port TX and provide a filtered output signal to an antenna port ANT. The transmit filter 45 includes series BAW resonators TS1, TS2, TS3, TS4, TS5, TS6, and TS7, shunt BAW resonators TP1, TP2, TP3, TP4, and TP5, series input inductor L1, and shunt inductor L2. Some or all of the BAW resonators TS1 to TS7 and/or TP1 to TP5 can be included in a BAW component in accordance with any suitable principles and advantages disclosed herein. For instance, the BAW component 40 of FIG. 3A or the BAW component 42 of FIG. 3B can include all of the BAW resonators of the transmit filter 45. In certain instances, a BAW component in accordance with any suitable principles and advantages disclosed herein can include BAW resonators of two or more acoustic wave filters. Any suitable number of series BAW resonators and shunt BAW resonators can be included in a transmit filter 45.

Figure 5:
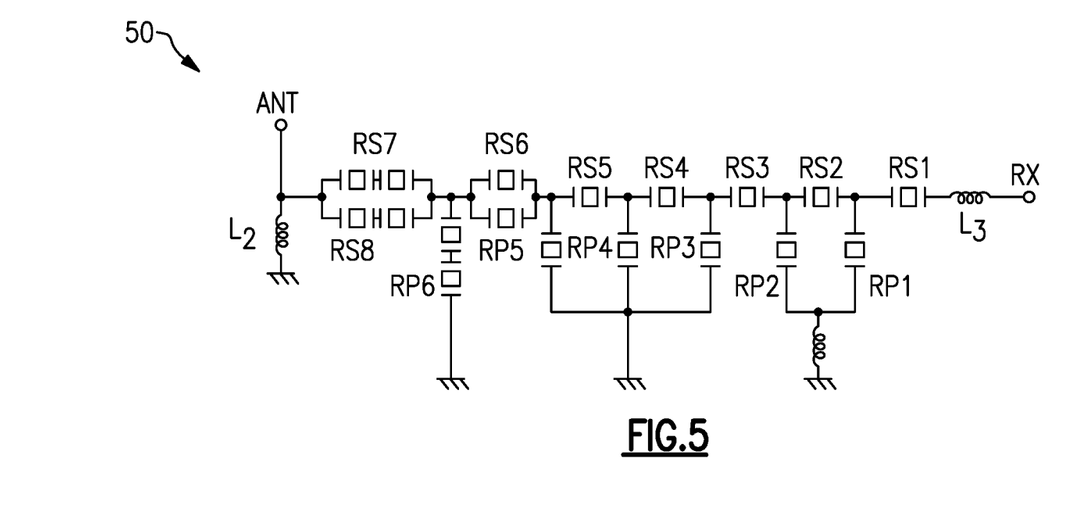
FIG. 5 is a schematic diagram of a receive filter that includes bulk acoustic wave resonators of a bulk acoustic wave component according to an embodiment.

FIG. 5 is a schematic diagram of a receive filter 50 that includes bulk acoustic wave resonators of a bulk acoustic wave component according to an embodiment. The receive filter 50 can be a band pass filter. The illustrated receive filter 50 is arranged to filter a radio frequency signal received at an antenna port ANT and provide a filtered output signal to a receive port RX. The receive filter 50 includes series BAW resonators RS1, RS2, RS3, RS4, RS5, RS6, RS7, and RS7, shunt BAW resonators RP1, RP2, RP3, RP4, and RP5, and RP6, shunt inductor L2, and series output inductor L3. Some or all of the BAW resonators RS1 to RS8 and/or RP1 to RP6 can be included in a BAW component in accordance with any suitable principles and advantages disclosed herein. For instance, the BAW component 40 of FIG. 3A or the BAW component 42 of FIG. 3B can include all of the BAW resonators of the receive filter 50. Any suitable number of series BAW resonators and shunt BAW resonators can be included in a receive filter 50.

Figure 6:
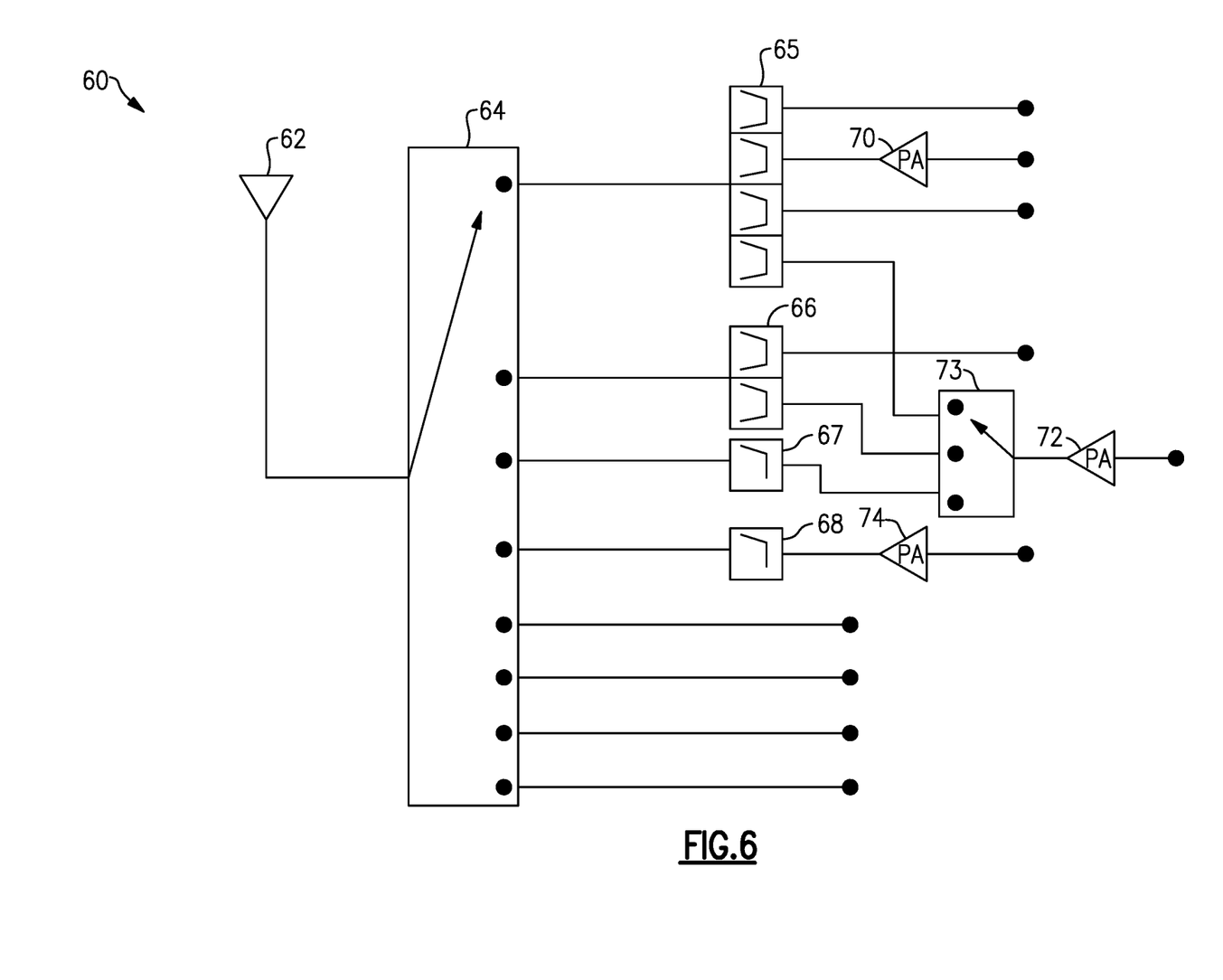
FIG. 6 is a schematic diagram of a radio frequency system that includes a bulk acoustic wave component according to an embodiment.

FIG. 6 is a schematic diagram of a radio frequency system 60 that includes a bulk acoustic wave component according to an embodiment. As illustrated, the radio frequency system 60 includes an antenna 62, an antenna switch 64, multiplexers 65 and 66, filters 67 and 68, power amplifiers 70, 72, and 74, and a select switch 73. The power amplifiers 70, 72, and 74 are each arranged to amplify a radio frequency signal. The select switch 73 can electrically connect an output of the power amplifier 72 to a selected filter. One or more filters of the multiplexer 65 and/or the multiplexer 66 can include one or more BAW resonators of a BAW component in accordance with any suitable principles and advantages discussed herein. In certain instances, a BAW component can include one or more filters of a multiplexer. Although the multiplexers illustrated in FIG. 6 include a quadplexer and a duplexer, one or more BAW resonators of a BAW component can be included in any other suitable multiplexer, such as a triplexer, a hexaplexer, an octoplexer, or the like. The antenna switch can selectively electrically connect one or more filters and/or one or more multiplexers to the antenna 62.

Figure 7:
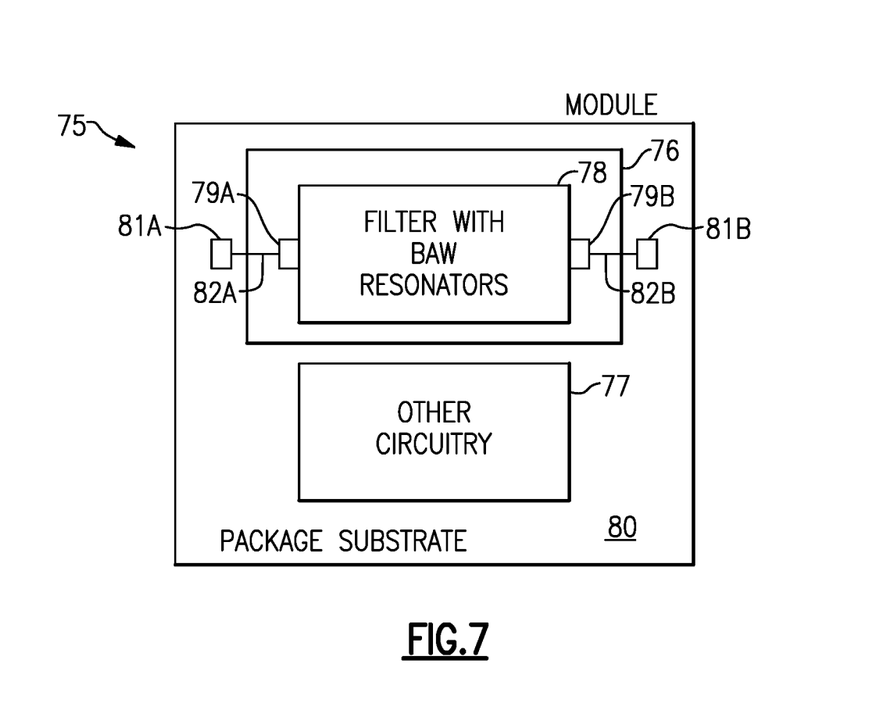
FIG. 7 is a schematic diagram of a radio frequency module that includes a bulk acoustic wave component according to an embodiment.
Figure 8:
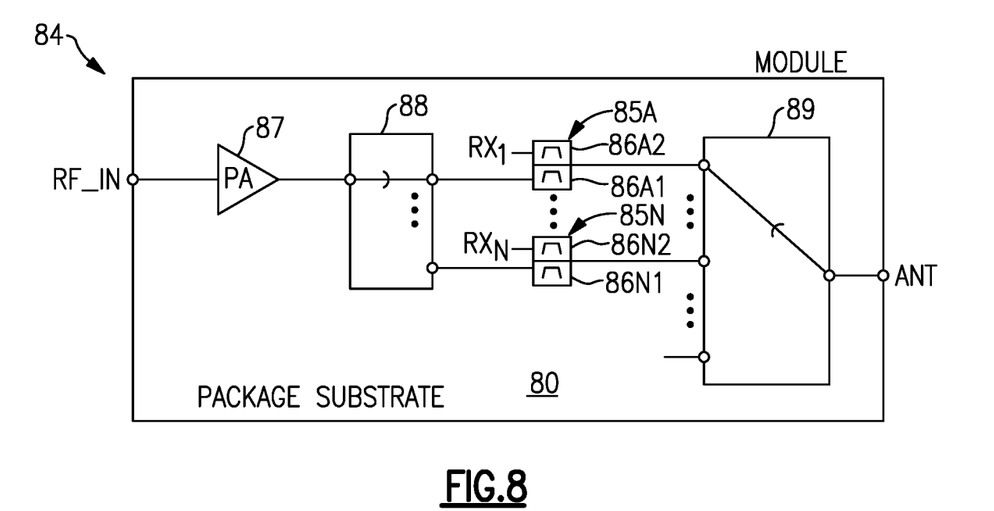
FIG. 8 is a schematic diagram of a radio frequency module that includes a bulk acoustic wave component according to an embodiment.

The BAW components discussed herein can be implemented in a variety of packaged modules. These BAW components can consume less area in packaged modules than similar modules that are diced using laser dicing. A packaged module configured to process a radio frequency signal can be referred to as a radio frequency module. Some radio frequency modules are front end modules. Radio frequency modules that include a BAW component in accordance with any suitable principles and advantages disclosed herein can also include one or more radio frequency amplifiers (e.g., one or more power amplifiers and/or one or more low noise amplifiers), one or more radio frequency switches, the like, or any suitable combination thereof. Example packaged modules will now be discussed in which any suitable principles and advantages of the BAW components discussed herein can be implemented. FIGS. 7 and 8 are schematic block diagrams of illustrative packaged modules according to certain embodiments. Any suitable combination of features of these embodiments can be combined with each other.

FIG. 7 is a schematic diagram of a radio frequency module 75 that includes a bulk acoustic wave component 76 according to an embodiment. The illustrated radio frequency module 75 includes the BAW component 76 and other circuitry 77. The BAW component 76 can include any suitable combination of features of the BAW components disclosed herein. The BAW component 76 can include a BAW die that includes BAW resonators.

The BAW component 76 shown in FIG. 7 includes a filter 78 and terminals 79A and 79B. The filter 78 includes BAW resonators. The terminals 79A and 78B can serve, for example, as an input contact and an output contact. The BAW component 76 and the other circuitry 77 are on a common packaging substrate 80 in FIG. 7. The package substrate 80 can be a laminate substrate. The terminals 79A and 79B can be electrically connected to contacts 81A and 81B, respectively, on the packaging substrate 80 by way of electrical connectors 82A and 82B, respectively. The electrical connectors 82A and 82B can be bumps or wire bonds, for example. The other circuitry 77 can include any suitable additional circuitry. For example, the other circuitry can include one or more power amplifiers, one or more radio frequency switches, one or more additional filters, one or more low noise amplifiers, the like, or any suitable combination thereof. The radio frequency module 75 can include one or more packaging structures to, for example, provide protection and/or facilitate easier handling of the radio frequency module 75. Such a packaging structure can include an overmold structure formed over the packaging substrate 75. The overmold structure can encapsulate some or all of the components of the radio frequency module 75.

FIG. 8 is a schematic diagram of a radio frequency module 84 that includes a bulk acoustic wave component according to an embodiment. As illustrated, the radio frequency module 84 includes duplexers 85A to 85N that include respective transmit filters 86A1 to 86N1 and respective receive filters 86A2 to 86N2, a power amplifier 87, a select switch 88, and an antenna switch 89. The radio frequency module 84 can include a package that encloses the illustrated elements. The illustrated elements can be disposed on a common packaging substrate 80. The packaging substrate can be a laminate substrate, for example.

The duplexers 85A to 85N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 86A1 to 86N1 can include one or more BAW resonators of a BAW component in accordance with any suitable principles and advantages disclosed herein. Similarly, one or more of the receive filters 86A2 to 86N2 can include one or more BAW resonators of a BAW component in accordance with any suitable principles and advantages disclosed herein. Although FIG. 8 illustrates duplexers, any suitable principles and advantages disclosed herein can be implemented in other multiplexers (e.g., quadplexers, hexaplexers, octoplexers, etc.) and/or in switch-plexers.

The power amplifier 87 can amplify a radio frequency signal. The illustrated switch 88 is a multi-throw radio frequency switch. The switch 88 can electrically couple an output of the power amplifier 87 to a selected transmit filter of the transmit filters 86A1 to 86N1. In some instances, the switch 88 can electrically connect the output of the power amplifier 87 to more than one of the transmit filters 86A1 to 86N1. The antenna switch 89 can selectively couple a signal from one or more of the duplexers 85A to 85N to an antenna port ANT. The duplexers 85A to 85N can be associated with different frequency bands and/or different modes of operation (e.g., different power modes, different signaling modes, etc.).

Figure 9A:
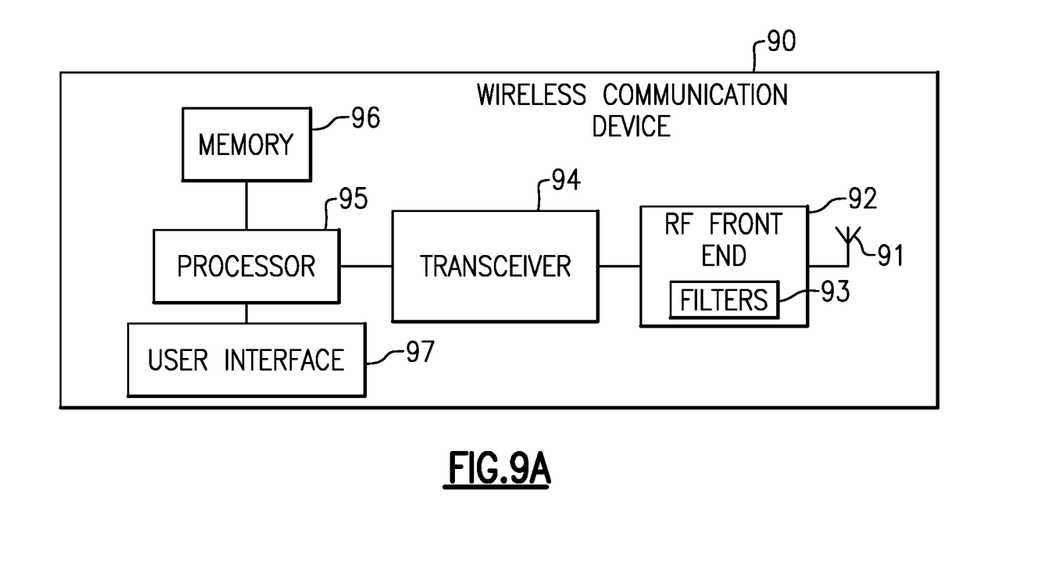
FIG. 9A is a schematic block diagram of a wireless communication device that includes a filter in accordance with one or more embodiments.

FIG. 9A is a schematic diagram of a wireless communication device 90 that includes filters 93 in a radio frequency front end 92 according to an embodiment. The filters 93 can include BAW resonators of a BAW component in accordance with any suitable principles and advantages discussed herein. The wireless communication device 90 can be any suitable wireless communication device. For instance, a wireless communication device 90 can be a mobile phone, such as a smart phone. As illustrated, the wireless communication device 90 includes an antenna 91, an RF front end 92, a transceiver 94, a processor 95, a memory 96, and a user interface 97. The antenna 91 can transmit RF signals provided by the RF front end 92. Such RF signals can include carrier aggregation signals.

The RF front end 92 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 92 can transmit and receive RF signals associated with any suitable communication standards. The filters 93 can include BAW resonators of a BAW component that includes any suitable combination of features discussed with reference to any embodiments discussed above.

The transceiver 94 can provide RF signals to the RF front end 92 for amplification and/or other processing. The transceiver 94 can also process an RF signal provided by a low noise amplifier of the RF front end 92. The transceiver 94 is in communication with the processor 95. The processor 95 can be a baseband processor. The processor 95 can provide any suitable base band processing functions for the wireless communication device 90. The memory 96 can be accessed by the processor 95. The memory 96 can store any suitable data for the wireless communication device 90. The user interface 97 can be any suitable user interface, such as a display with touch screen capabilities.

Figure 9B:
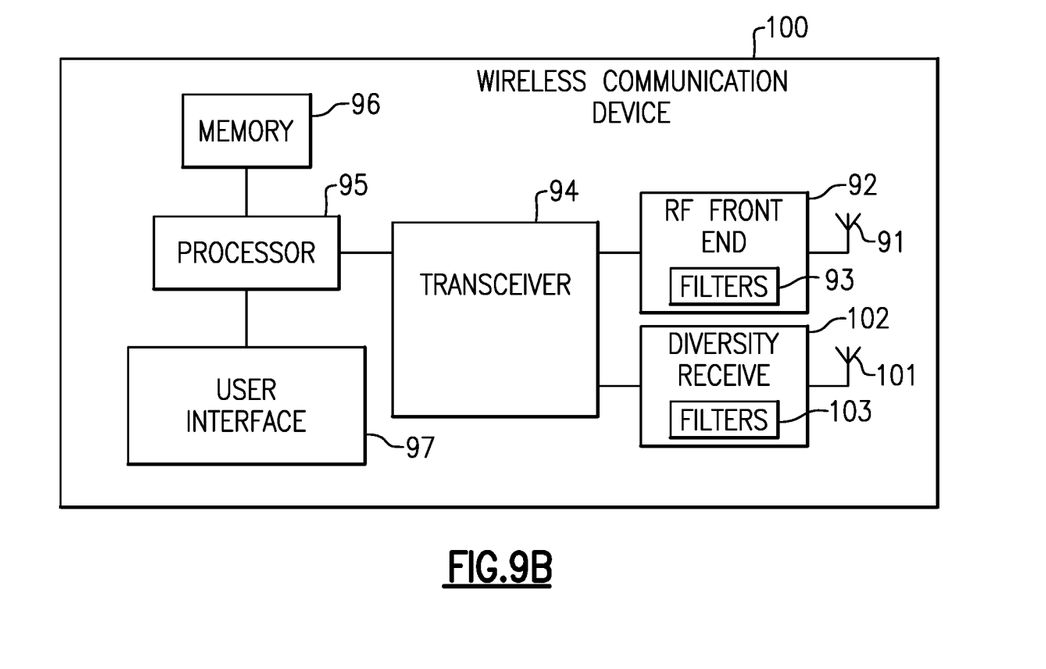
FIG. 9B is a schematic block diagram of another wireless communication device that includes a filter in accordance with one or more embodiments.

FIG. 9B is a schematic diagram of a wireless communication device 100 that includes filters 93 in a radio frequency front end 92 and a second filter 103 in a diversity receive module 102. The wireless communication device 100 is like the wireless communication device 90 of FIG. 9A, except that the wireless communication device 100 also includes diversity receive features. As illustrated in FIG. 9B, the wireless communication device 100 includes a diversity antenna 101, a diversity module 102 configured to process signals received by the diversity antenna 101 and including filters 103, and a transceiver 104 in communication with both the radio frequency front end 92 and the diversity receive module 102. The filters 103 can include BAW resonators of a BAW component that includes any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink cellular device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals having a frequency in a range from about 30 kilohertz (kHz) to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as die and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bulk acoustic wave component comprising:
    a substrate;
    at least one bulk acoustic wave resonator on the substrate;
    a buffer layer on an opposite side of the substrate than the least one bulk acoustic wave resonator, the buffer layer including a material having an etching rate that is over 30 times slower compared to an etching rate of silicon; and
    a cap enclosing the at least one bulk acoustic wave resonator, the cap including a sidewall spaced apart from an edge of the substrate, the sidewall being 5 microns or less from the edge of the substrate.

2. The bulk acoustic wave component of claim 1 wherein the sidewall is 3 microns or less from the edge of the substrate.

3. The bulk acoustic wave component of claim 1 wherein the sidewall is at least 1 micron from the edge of the substrate.

4. The bulk acoustic wave component of claim 1 further comprising a via extending through the substrate and a conductive layer in the via, a portion of the buffer layer being in the via, and the buffer layer including a resin.

5. The bulk acoustic wave component of claim 1 further comprising a via extending through the substrate, a conductor extending laterally from the via and electrically connected with conductive layer in the via, and solder on the conductor and located laterally from the via such that the solder is non-overlapping with the via.

6. The bulk acoustic wave component of claim 1 wherein the at least one bulk acoustic wave resonator includes a film bulk acoustic wave resonator.

7. The bulk acoustic wave component of claim 1 wherein the at least one bulk acoustic wave resonator includes a solidly mounted resonator.

8. The bulk acoustic wave component of claim 1 wherein the substrate is a silicon substrate.

9. The bulk acoustic wave component of claim 8 wherein a top portion of the cap includes a silicon cap substrate.

10. The bulk acoustic wave component of claim 1 wherein the sidewall includes copper.

11. The bulk acoustic wave component of claim 1 wherein the at least one bulk acoustic wave resonator includes a plurality of bulk acoustic wave resonators included in a filter arranged to filter a radio frequency signal.

12. The bulk acoustic wave component of claim 11 wherein the plurality of bulk acoustic wave resonators include at least 10 bulk acoustic wave resonators.

13. The bulk acoustic wave component of claim 1 wherein the sidewall is 5 microns or less from the edge of the substrate as a result of plasma dicing.

14. A bulk acoustic wave component comprising:
    a silicon substrate;
    at least one bulk acoustic wave resonator on the silicon substrate;
    a buffer layer on an opposite side of the silicon substrate than the least one bulk acoustic wave resonator, the buffer layer including a material having an etching rate that is over 30 times slower for plasma dicing compared to an etching rate of silicon for the plasma dicing; and
    a cap enclosing the at least one bulk acoustic wave resonator, the cap including a cap substrate and a sidewall, the cap substrate including silicon, the sidewall spaced apart from an edge of the silicon substrate by a distance in a range from 1 micron to 5 microns.

15. The bulk acoustic wave component of claim 14 further comprising a via extending through the silicon substrate and a conductive layer in the via, a portion of the buffer layer being in the via, and the buffer layer including a resin.

16. The bulk acoustic wave component of claim 14 further comprising a via extending through the silicon substrate, a conductor extending laterally from the via and electrically connected with conductive layer in the via, and solder on the conductor and located laterally from the via such that the solder is non-overlapping with the via.

17. The bulk acoustic wave component of claim 14 wherein the sidewall includes copper.

18. The bulk acoustic wave component of claim 14 wherein the at least one bulk acoustic wave resonator includes at least 10 bulk acoustic wave resonators included in an acoustic wave filter arranged to filter a radio frequency signal.

19. The bulk acoustic wave component of claim 14 wherein the buffer layer includes phenol resin.

20. A wireless communication device comprising:
an antenna; and
a bulk acoustic wave component including a substrate, bulk acoustic wave resonators on the substrate, a buffer layer on an opposite side of the substrate than the bulk acoustic wave resonators, and a cap enclosing the bulk acoustic wave resonators, the cap including a sidewall that is spaced apart from an edge of the substrate by 5 microns or less, the buffer layer including a material having an etching rate that is over 30 times slower compared to an etching rate of silicon, and the bulk acoustic wave resonators being included in a filter in communication with the antenna.

21. The wireless communication device of claim 20 wherein the wireless communication device is configured as a mobile phone.

22. The wireless communication device of claim 20 further comprising a radio frequency amplifier in communication with the filter and a switch coupled between the filter and the antenna.

* * * * *

UNITED STATES PATENT AND TRADEMARK OFFICE
CERTIFICATE OF CORRECTION

PATENT NO. : 11,251,769 B2  
APPLICATION NO. : 16/599032  
DATED : February 15, 2022  
INVENTOR(S) : Atsushi Takano et al.

Page 1 of 1

It is certified that error appears in the above-identified patent and that said Letters Patent is hereby corrected as shown below:

On the Title Page

Column 1 Item (71) (Applicant), Line 1-2, delete "Woburn, MA (US)" and insert -- Irvine, CA (US) --.

In the Specification

Column 8, Line 48, delete "DS w" and insert -- $D_{SW}$ --.

In the Claims

Column 14, Line 2, Claim 1, before "least" insert -- at --.

Column 14, Line 54, Claim 14, before "least" insert -- at --.

Signed and Sealed this
Twenty-sixth Day of July, 2022

Katherine Kelly Vidal
*Director of the United States Patent and Trademark Office*